United States Patent [19]

Wortman et al.

[11] Patent Number: 5,253,324
[45] Date of Patent: Oct. 12, 1993

[54] CONICAL RAPID THERMAL PROCESSING APPARATUS

[75] Inventors: Jimmie J. Wortman, Chapel Hill; Furman Y. Sorrell, Cary; John R. Hauser, Raleigh; Mark J. Fordham, Durham, all of N.C.

[73] Assignee: North Carolina State University, Raleigh, N.C.

[21] Appl. No.: 953,568

[22] Filed: Sep. 29, 1992

[51] Int. Cl.$^5$ .............. A21B 2/00; F26B 3/30; F27B 9/04; F27B 9/06

[52] U.S. Cl. .................. 392/416; 392/418; 219/390; 219/405; 118/724; 432/120

[58] Field of Search ............. 392/416, 418; 219/390, 219/405, 411; 118/724, 725, 728, 730, 50.1; 432/120

[56] References Cited

U.S. PATENT DOCUMENTS

| 3,862,397 | 1/1975 | Anderson et al. | 219/405 |
| 4,446,817 | 5/1984 | Crawley | 118/725 |
| 4,789,921 | 12/1988 | Aho | 362/348 |
| 5,070,815 | 10/1991 | Kasai et al. | 118/725 |
| 5,133,286 | 7/1992 | Choo et al. | 118/725 |

FOREIGN PATENT DOCUMENTS

| 488289 | 7/1925 | Fed. Rep. of Germany | 219/390 |
| 261024 | 10/1988 | German Democratic Rep. | 118/730 |
| 61-210622 | 9/1986 | Japan | 118/730 |
| 62-228609 | 9/1988 | Japan | 118/725 |
| 63-293913 | 11/1988 | Japan | 118/728 |
| 1-123413 | 5/1989 | Japan | 118/725 |
| 2-122616 | 5/1990 | Japan | 118/728 |
| 3-54193 | 3/1991 | Japan | 118/730 |
| 3-265128 | 11/1991 | Japan | 118/725 |
| 4-107816 | 4/1992 | Japan | 118/730 |

OTHER PUBLICATIONS

Deines, J. L. and Hu, S. M., "Susceptor-Reactor", *IBM Technical Disclosure Bulletin*, vol. 17, No. 2, Jul. 1974.

*Primary Examiner*—Bruce A. Reynolds
*Assistant Examiner*—John A. Jeffrey
*Attorney, Agent, or Firm*—Bell, Seltzer, Park & Gibson

[57] ABSTRACT

A conical rapid thermal processing system includes a conical thermal radiation reflector and a plurality of elongated radiant heating sources within the conical thermal radiation reflector. The elongated radiant heating sources pass through an imaginary conical surface within the conical thermal radiation reflector. A wafer holder within the imaginary conical surface holds the wafer face transverse to the common axis of the conical reflector and the conically arranged radiant heating lamps. The conical thermal radiation reflector and conically arranged lamps provide uniform radiant heating across the face of a wafer without significantly degrading coupling efficiency.

31 Claims, 6 Drawing Sheets

CONICAL RAPID THERMAL PROCESSING APPARATUS

FIELD OF THE INVENTION

This invention relates to thermal processing systems for fabricating semiconductor wafers and other microelectronic devices, and more particularly to rapid thermal processing systems for semiconductor wafer manufacturing.

BACKGROUND OF THE INVENTION

Rapid thermal processing systems are being increasingly used for microelectronic device fabrication. As is well known to those having skill in the art, rapid thermal processing systems attain a desired processing temperature rapidly, without the need for a lengthy "ramp-up" period. It has been found that rapid thermal processing systems allow microelectronic devices to be fabricated at high temperatures without causing dopant diffusion or other unwanted side effects. Since rapid thermal processing systems typically process semiconductor wafers, the term "wafer" will be used herein to designate any device processed in the rapid thermal processing system. It will be understood by those having skill in the art that other substrates or materials may be processed.

In contrast with a conventional furnace which typically uses resistive heating units, a rapid thermal processing system typically uses radiant heat sources, for example, arc lamps or tungsten-halogen lamps. A small processing chamber is typically used, to provide a controlled environment for the wafer to be processed and to efficiently couple the heat energy from the radiant energy sources to the wafer. Rapid thermal processing systems have heretofore been used for rapid thermal annealing and rapid thermal oxidation of semiconductor wafers. More recently, rapid thermal processing systems have also been used in rapid thermal chemical vapor deposition processes.

Two major design considerations in a rapid thermal processing system are heating efficiency and heating uniformity. Efficient coupling of the radiant heat from the lamps to the wafer is necessary so that large increases in wafer temperature can be produced in a short time. Moreover, in producing the rapid increase in wafer temperature, uniform heat must be provided across the face of the wafer. Lack of uniformity can produce excessive microelectronic device variation across the face of the wafer and may even lead to wafer cracking.

Conventional rapid thermal processing systems use a cylindrical quartz tube as a thermal processing chamber, with a wafer holder for holding the wafer face transverse to the axis to the tube. One or more lamps is placed above and/or below the wafer, to radiate onto the face of the wafer. See, for example, U.S. Pat. Nos. 4,481,406 to Muka entitled *Heater Assembly for Thermal Processing of a Semiconductor Wafer in a Vacuum Chamber;* 4,560,420 to Lord entitled *Method for Reducing Temperature Variations Across a Semiconductor Wafer During Heating,* and 4,818,327 to Davis et al. entitled *Wafer Processing Apparatus.*

Rapid thermal processing system with lamps above and/or below the face of the wafer can efficiently couple radiant energy from the lamps to the wafer face. Unfortunately, poor thermal uniformity across the face of the wafer is often present.

Recently, a rapid thermal processing system has been proposed, in which a plurality of lamps extend in a cylinder around the edge of the wafer. See a publication entitled *A Cylindrical Tube Based Rapid Thermal Processor* by D. T. Chapman et al., including the present inventors, Extended Abstracts of the 179th Electrochemical Society Meeting, No. 358, pp. 541, May 1991, the disclosure of which is hereby incorporated herein by reference. Unfortunately, although this design results in improved thermal uniformity, coupling efficiency between the radiant sources and the wafer is low. Therefore, this configuration may not produce as high a wafer temperature, or as rapid a temperature increase, as is desirable.

SUMMARY OF THE INVENTION

It is therefore an object of the invention to provide an improved rapid thermal processing system.

It is another object of the present invention to provide a rapid thermal processing system which efficiency couples radiant energy from the radiant sources to the wafer face.

It is still another object of the present invention to provide a rapid thermal processing system which allows uniform heating across the face of the wafer.

These and other objects are provided, according to the present invention, by a conical rapid thermal processing system. The conical rapid thermal processing system includes a conical thermal radiation reflector and a plurality of elongated radiant heating sources within the conical thermal radiation reflector. The elongated radiant heating sources pass through an imaginary conical surface within the conical thermal radiation reflector. A wafer holder within the imaginary conical surface holds the wafer face transverse to the axis of the conical reflector and the conically arranged radiant heating lamps. In other words, the conical reflector and conically arranged lamps form an oblique angle (neither 0° nor 90°) with the axis of the thermal processing system. The conical thermal radiation reflector and conically arranged elongated lamps provide uniform radiant heating across the face of a wafer extending transverse to the coincident axes of the conical thermal radiation reflector and the conically arranged lamps, without significantly degrading coupling efficiency.

Preferably, the conical thermal radiation reflector is a truncated cone with a relatively large base and a relatively small truncated surface opposite the base. The conical thermal radiation reflector forms an angle with its imaginary axis of between about 7.5° and 30°, and more preferably between about 10° and 20°, and most preferably about 15°. A thermal processing chamber, preferably a cylindrical quartz tube, surrounds the wafer holder and has an axis which is coincident with the axis of the conical reflector and conically arranged bank of lamps. The wafer holder preferably includes a wafer support extending transverse to the coincident axes of the conical reflector, conically arranged bank of lamps and cylindrical chamber. The wafer holder also includes means for moving the wafer holder along the coincident axes for entry and removal of the wafer and for positioning the wafer within the chamber.

The conical bank of heat lamps may include a single array of heat lamps arranged to extend along an imaginary truncated conical surface from the base thereof to the truncated surface thereof opposite the base. However, in order to better control the rapid thermal process, a first and a second plurality of linear heat lamps is provided. The first plurality of linear heat lamps extend along the imaginary truncated cone from the base thereof towards the truncated surface thereof. The second plurality of linear heat lamps extend along the imaginary truncated cone from the truncated surface thereof towards the base thereof. The first and second plurality of lamps preferably overlap at the center of the imaginary truncated cone and are independently controlled. Independent control allows a slight increase in radiant heat flux to be produced at the edge of the wafer to compensate for heat loss from the edge of the wafer. The preferred angle of the conically arranged bank of heat lamps is the same as was described for the conical reflector.

The conical thermal reflector of the present invention can be used with configurations of radiant heating means other than the conically arranged configuration described above. Similarly, the conically arranged configuration of heat lamps described above can be used with reflectors other than the conical reflector described above. However, preferably, the conical thermal radiation reflector and the conically arranged heat lamps are used in combination, to provide efficient and uniform coupling of radiant energy to a wafer in a rapid thermal processing apparatus.

DETAILED DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
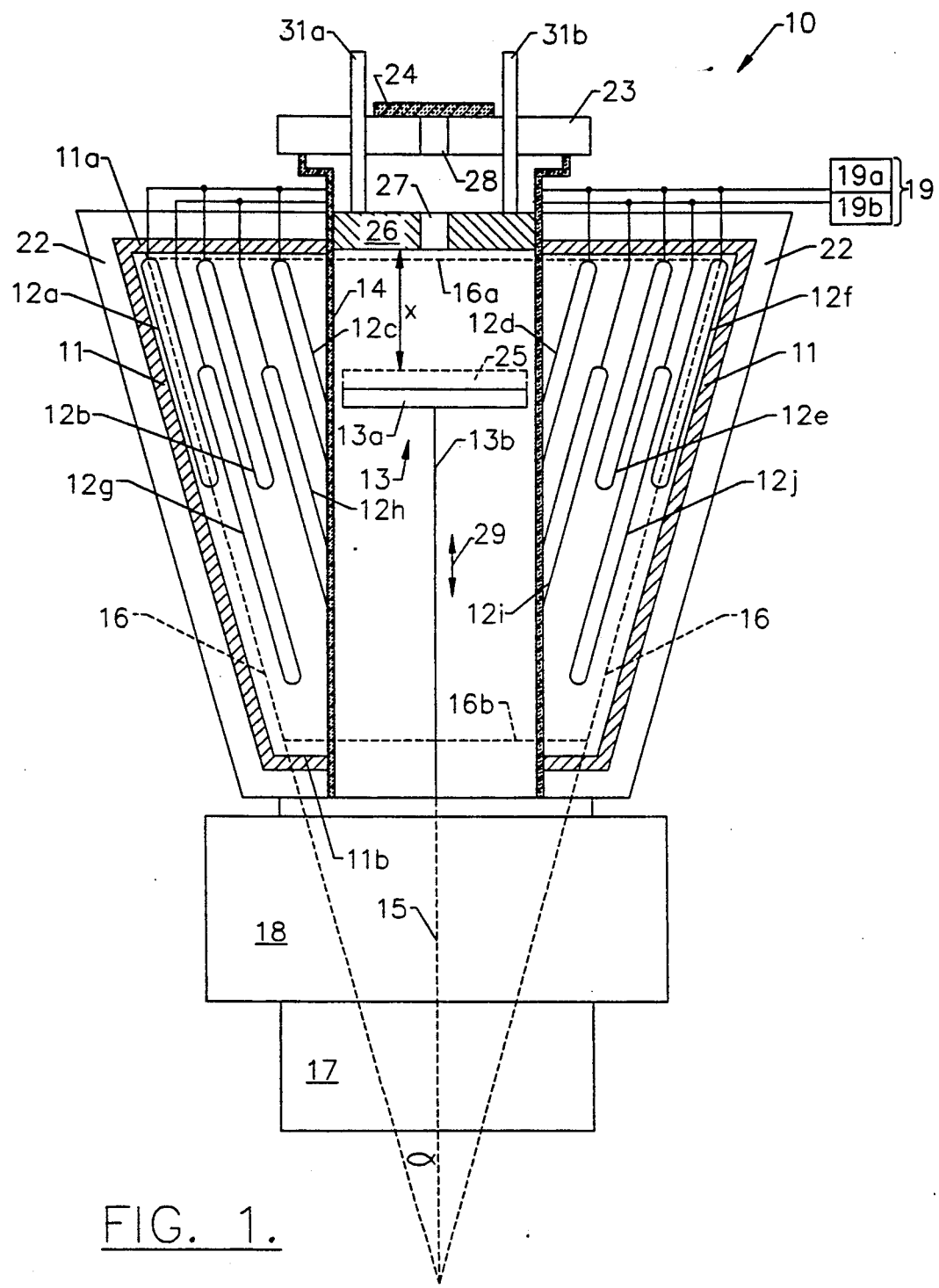
FIG. 1 is a schematic cross-sectional view of a rapid thermal processing apparatus according to the present invention.

Referring now to FIG. 1, there is illustrated a schematic cross-sectional view of a rapid thermal processing apparatus according to the present invention. Rapid thermal processing apparatus 10 includes a truncated, conical, thermal radiation reflector 11. As is well known to those having skill in the art, the surface of truncated conical reflector 11 is defined by the hypotenuse of a right triangle which rotates about one of its legs, referred to as axis 15 The truncated conical reflector may also include a reflector surface 11a at the base thereof and a reflector surface 11b at the surface of the cone, opposite the base. The reflectors may be formed of stainless steel, or other known materials, and aluminum, may be plated with gold or other known materials on their inner surface to increase the reflectivity thereof. It will be understood that truncated conical reflector 11 is an inverted truncated cone, with the base above the truncated surface. However, a noninverted truncated cone may also be used.

Still referring to FIG. 1, a plurality of elongated radiant heating means 12a-12j are arranged about an imaginary axis to extend along an imaginary conical surface 16 about the imaginary axis. Preferably, the imaginary axis of the imaginary conical surface 16 coincides with imaginary axis 15 of the conical reflector 11. The radiant heating means are preferably linear tungsten-halogen lamps, although other known radiant sources may be used. Each linear tungsten-halogen lamp is preferably coplaner with the axis 15. Conventional brackets or other support means (not shown) are used to support lamps 12a-12j.

The plurality of lamps 12a-12j may be arranged in a single array, with each lamp extending from the imaginary base 16a of the imaginary conical surface 16 to the imaginary truncated surface 16b of the imaginary truncated conical surface 16 opposite imaginary base 16a. However, preferably, according to the present invention, two arrays of lamps are provided. A first array, including lamps 12a-12f, extends from the imaginary base 16a towards the imaginary truncated surface 16b. A second array, including lamps 12g-12j, extends from imaginary truncated surface 16b towards imaginary base 16a. The first and second arrays overlap at the center of the imaginary conical surface as shown in FIG. 1. Alternatively, the first array may extend from imaginary base 16a to imaginary truncated surface 16b, and the second array may extend from imaginary truncated surface 16b towards imaginary base 16a. Other configurations are also possible.

As also shown in FIG. 1, heat lamp energizing means 19 may be used to energize lamps 12a-12j. Preferably, heat lamp energizing means includes independently controllable first and second energizing means 19a and 19b, respectively, for independently controlling the first array of heat lamps 12a-12f and the second array of heat lamps 12g-12j via wires 21a and 21b, respectively. Independent control of the two arrays of lamps allows tailoring of the thermal gradients to account for edge radiation effects as will be described below.

Still referring to FIG. 1, a thermal processing chamber 14 surrounds wafer holding means 13. Thermal processing chamber 14 is preferably a cylindrical quartz thermal processing chamber having an axis which is coincident to axis 15. Conical thermal radiation reflecting means 11 and conically arranged lamps 12a-12j are preferably outside the thermal processing chamber 14.

Wafer holding means 13 is contained within thermal processing chamber 14. Wafer holding means 13 preferably comprises a wafer support 13a having a flat face adapted for receiving at one or more wafers 25 thereon. Wafer support 13a preferably extends transverse to axis 15. A wafer positioner 13b preferably extends along axis 15 and allows movement along axis 15 in the directions shown by arrow 29. Movement in the directions 29 allows positioning of the wafer 25 within the chamber 14 and also allows insertion and removal of the wafer 25.

Wafer holding means 13 is preferably coupled to a load lock 18 which includes an access door and other conventional wafer handling systems. A vacuum pump 17 may be used to evacuate chamber 14 when necessary. One or more gas inlets and outlets (not shown in FIG. 1) may be provided for pumping reactive and/or nonreactive gases through chamber 10 using techniques well known to those skilled in the art.

Still referring to FIG. 1, an end cap 23 may be provided to seal chamber 14. End cap 23 may be water cooled and preferably includes a glass window 24 thereon and an aperture 28 therein to permit viewing of the wafer 25 in the chamber 14. A reflector 26 having flat, parabolic or other cross-sectional shape, may also be provided to improve radiant energy coupling uniformity. Reflector 26 preferably includes an aperture 27 to allow viewing of wafer 25.

Conical thermal radiation reflector 11 is preferably surrounded by a water cooling jacket 22 which may be cooled via chilled water or other known means through inlets and outlets not shown. An inlet 31a and outlet 31b may also be provided for cooling of end cap 23 and/or reflector 26.

The thermal processing apparatus of FIG. 1, with its oblique angle lamps and reflector, provides improved heating uniformity compared to a conventional rapid thermal processing apparatus with lamps above and/or below the wafer face, and provides increased efficiency compared to a known system with cylindrical lamps and reflectors. FIG. 1 illustrates the oblique angle $\alpha$ between the truncated conical reflector 11 and conically arranged lamps 12a–12j and their common axes 15. If angle $\alpha$ is 0° then a cylindrical rapid thermal processing apparatus is produced, with reduced radiation coupling efficiency. If angle $\alpha$ is 90°, then a conventional rapid thermal processing system with lamps above the wafer face is produced, with reduced heating uniformity.

Angle $\alpha$ was optimized by the present inventors using a wafer heat transfer model and a ray tracing technique. The wafer heat transfer model and ray tracing technique optimization are described in a publication by coinventor Sorrell et al. entitled *Temperature Uniformity in RTP Furnaces*, published in IEEE Transactions on Electron Devices, Vol. 39, No. 1, Jan. 1992, pp. 75–79, the disclosure of which is hereby incorporated herein by reference. Optimization of angle $\alpha$ assumed a six inch diameter wafer and a thermal processing chamber 14 having an 8 inch diameter. Truncated conical reflector 11 was assumed to be 16 inches long with the truncated surface of the conical reflector 11b being 9.5 inches in diameter. The angle $\alpha$ was selected to provide a slight increase in heat flux at the edge of the wafer face, in order to offset the heat loss from the edge of the wafer.

Figure 2:
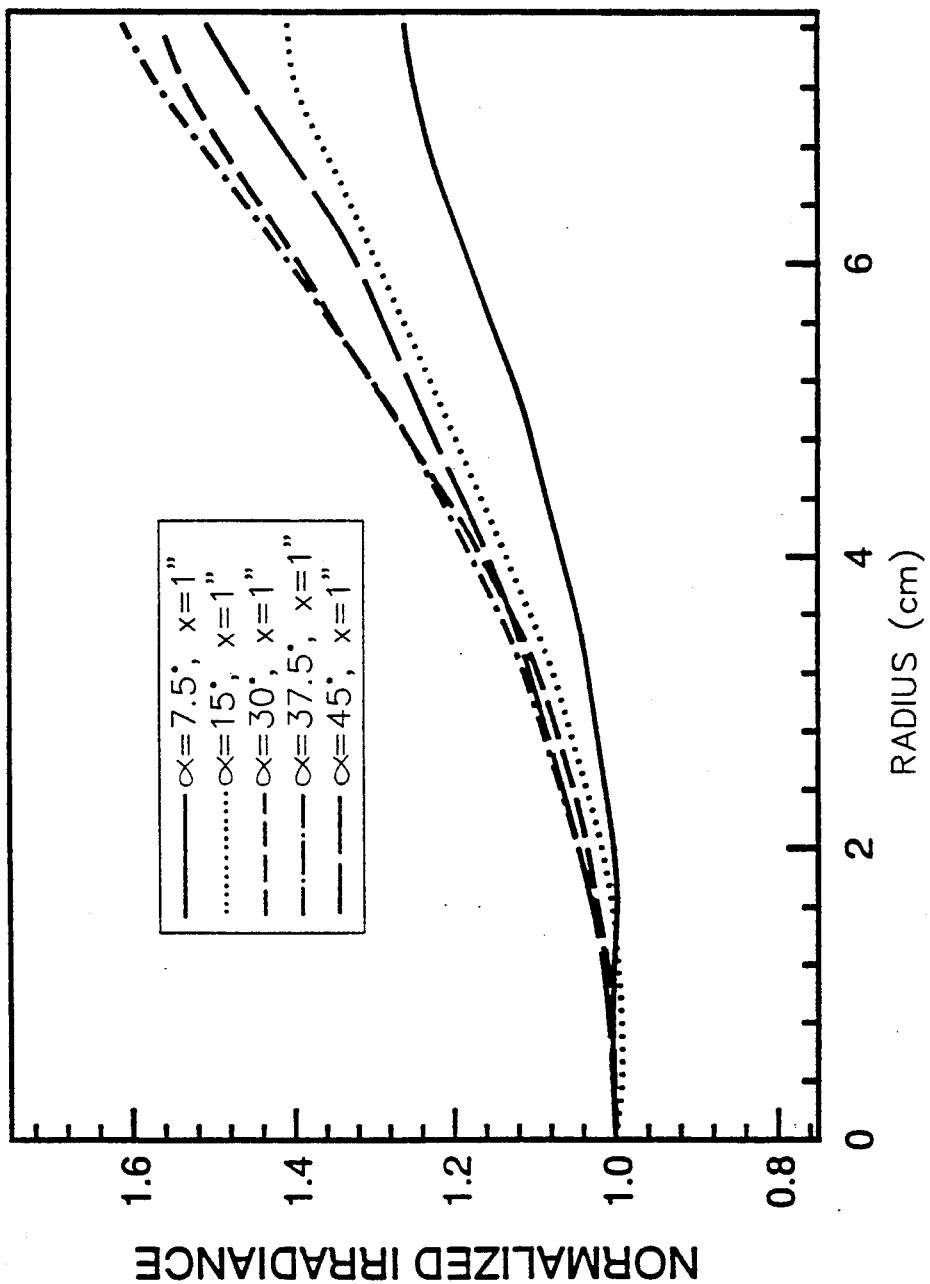
FIGS. 2-5 graphically illustrate normalized irradiance versus wafer radius for the rapid thermal processing apparatus of FIG. 1.
Figure 3:
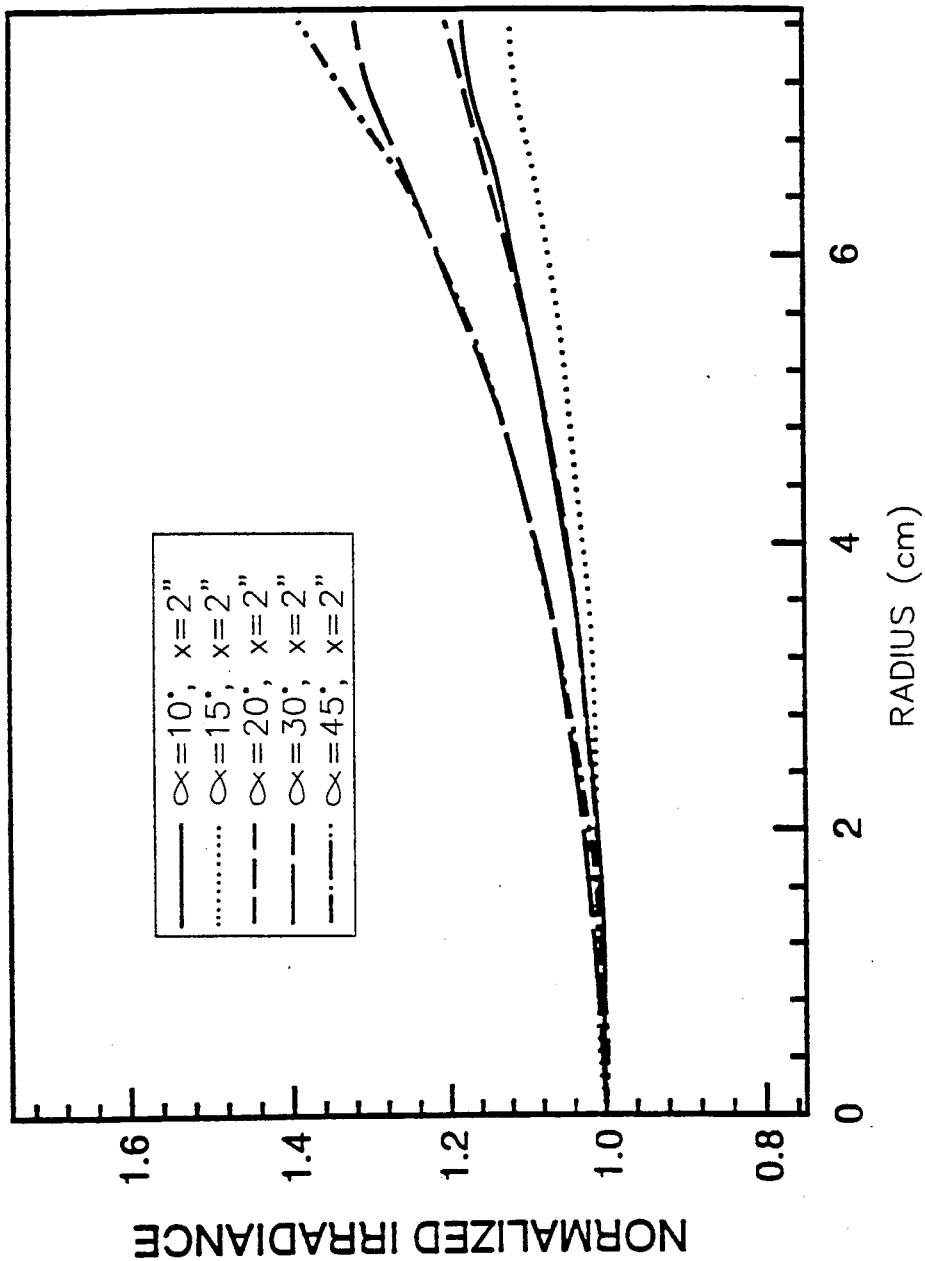
Figure 4:
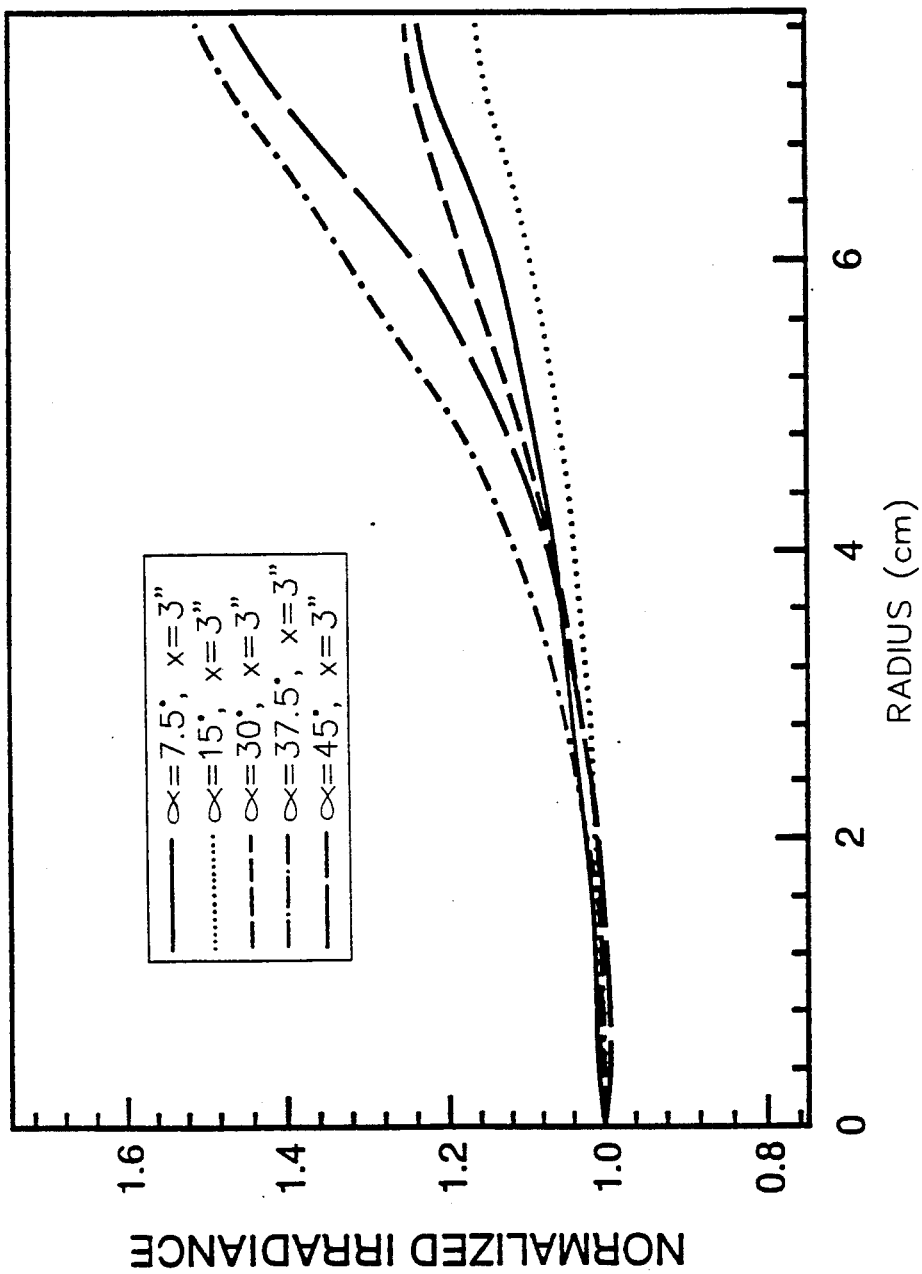

FIG. 2 graphically illustrates the normalized heat flux or irradiance as a function of radial position on the wafer, with the wafer 15 being located in chamber 10 at a distance "x" between wafer 25 and the base 16a of the conical reflector. FIG. 2 graphically illustrates normalized irradiance versus wafer radius in centimeters for various angles $\alpha$ at x=1 inch. FIGS. 3 and 4 provide similar results for x= 2 inches and 3 inches. Based on the data shown, an angle $\alpha$ between 7.5° and 30° is preferable with a range of between 10° and 20° being more preferable and an angle of 15° being most preferable. Elevation x of 2 inches is also most preferable.

Figure 5:
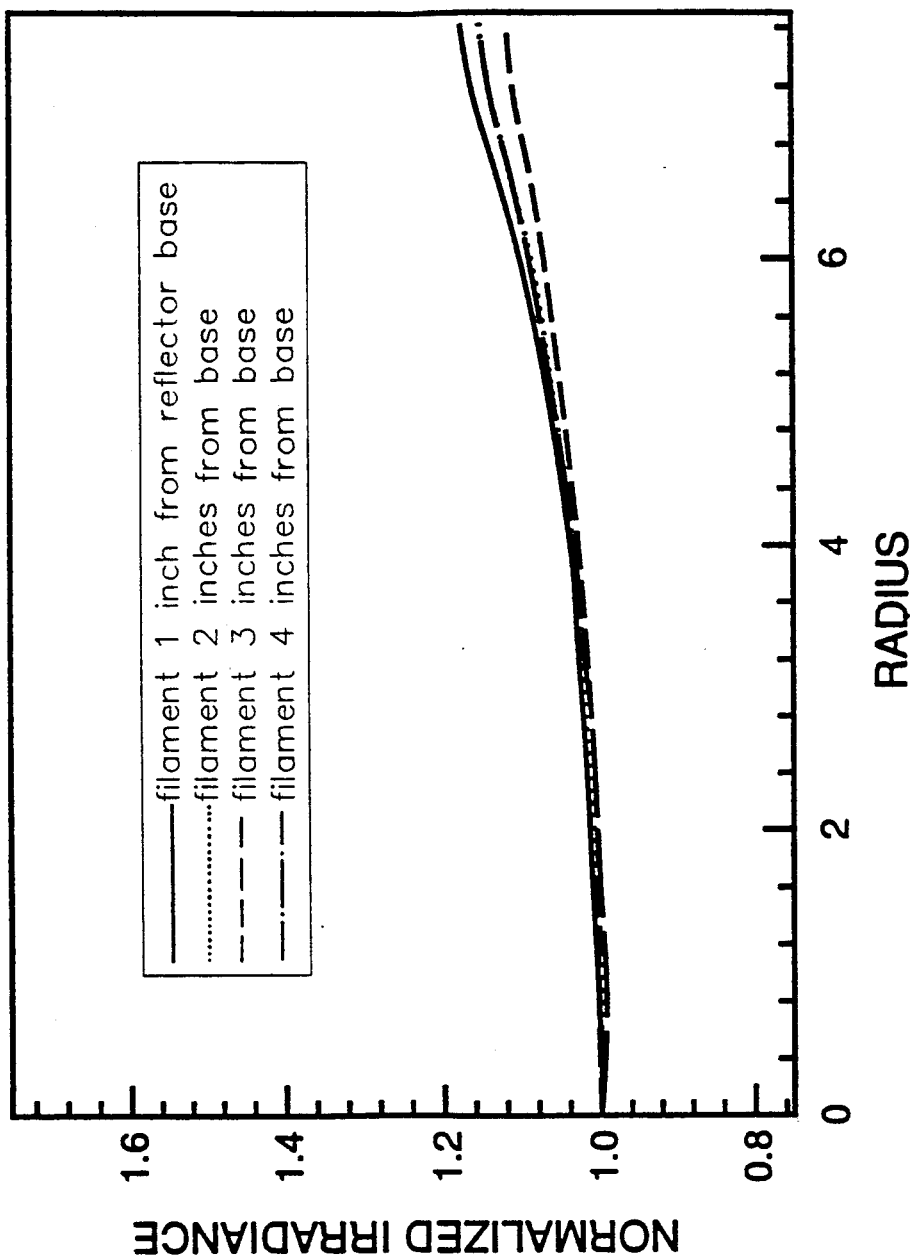

The location of lamps 12 within conical thermal radiation reflector 11 was also considered. Simulations were restricted to the 15° angle $\alpha$ and 2 inch elevation x. A specific lamp and lamp filament was used to determine the optimum lamp location. In particular, 1.5 kw tungsten-halogen lamps having a total lamp length of 10.625 inches and a filament length of 6.75 inches, such as the Sylvania Model 1500T3Q/CL, were used. As shown in FIG. 5, the most uniform heating occurs when the filaments of lamps 12g–12j begin three inches down from the reflector base 11a.

The above cited Sorrell et al. publication indicated that the heat flux or irradiance distribution to produce uniform processing temperature varies with the process conditions. As shown, in some situations, and also during ramp-up or ramp-down, the irradiance profile for a uniform temperature may require more edge heating. This is addressed by locating the lamps in two arrays. First array 12a–12f provides the additional edge heating when necessary, while the second array 12g–12j provides the primary heating. As shown in FIG. 1, the filaments of lamps 12a–12f preferably begin at the reflector base 11a. By independently controlling the two arrays of lamps using controllers 19a and 19b, an irradiance profile with more edge heating can be produced. It will be understood by those having skill in the art that the preferred location of lamps 12a–12j will vary with the geometry of the system. Typically lamps 12g–12j provide most of the heat to the wafer and lamps 12a–12f are used to increase the heat flux to the edges for those processes or process conditions where additional heat flux is needed. However, lamps 12a–12f will also heat other parts of the wafer, so that the power to each of the controllers 19a and 19b must be controlled to produce the desired thermal profile.

Figure 6:
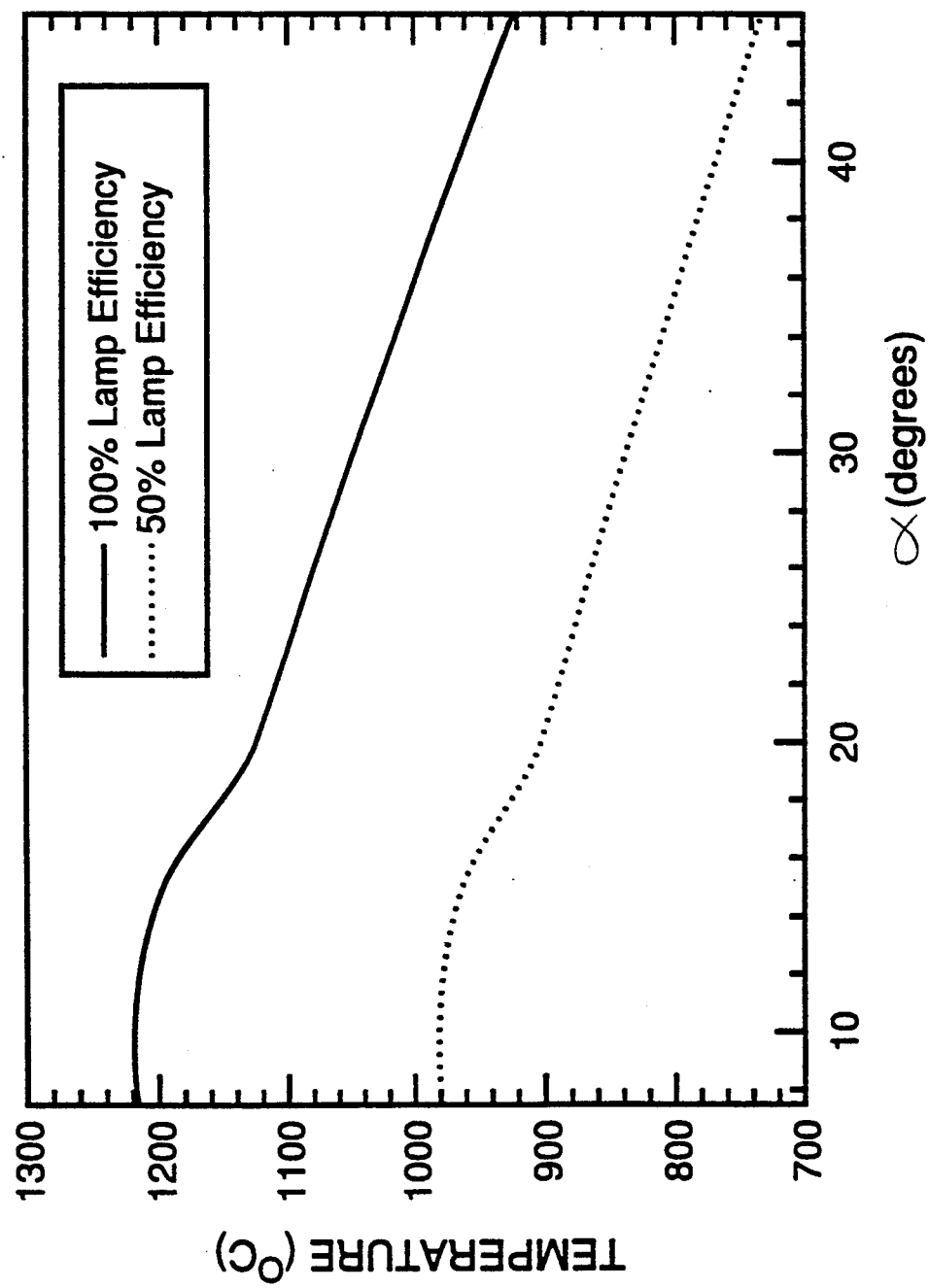
FIG. 6 graphically illustrates maximum wafer temperature versus cone angle for the rapid thermal processing apparatus of FIG. 1.

Simulations were also performed by the present inventors to verify that the above described configuration provides sufficient total heating to the wafer so that desired process temperatures can be achieved. In order to investigate this, a simulation was used to predict the maximum temperature of the wafer for different angles $\alpha$. FIG. 6 graphically illustrates maximum wafer temperature versus angle $\alpha$. The maximum possible temperature in a cylindrical system (i.e. $\alpha = 0°$), is much less than those shown in FIG. 6 for cone angles between 7½ and 20°. As shown in FIG. 6, maximum temperature decreases sharply after about 15°. Accordingly, it has been shown in that the conical rapid thermal processing system of the present invention can provide high coupling efficiency and high wafer temperatures, while providing uniform irradiance across the face of the wafer, with increased irradiance at the wafer edge if desired.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An apparatus for thermally processing a wafer comprising:

conical thermal radiation reflecting means;

radiant heating means within said conical thermal radiation reflecting means;

a cylindrical thermal processing chamber surrounding said wafer holding means, said cylindrical thermal processing chamber having an imaginary axis which is coincident with the imaginary axis of said conical thermal radiation reflecting means, and wherein said conical thermal radiation reflecting means and said radiant heating means are outside said thermal processing chamber; and wafer holding means within said cylindrical thermal processing chamber, said wafer holding means comprising:

a wafer support extending transverse to the imaginary axis of said cylindrical thermal processing chamber, for supporting a wafer face transverse to the imaginary axis of said cylindrical thermal processing chamber; and means for moving said wafer support along the imaginary axis of said thermal processing chamber.

2. The apparatus of claim 1 wherein said conical thermal radiation reflecting means forms a predetermined angle with an imaginary axis thereof, and wherein said predetermined angle is between about 7.5 degrees and about 30 degrees.

3. The apparatus of claim 2 wherein said predetermined angle is between about 10 degrees and about 20 degrees.

4. The apparatus of claim 3 wherein said predetermined angle is about 15 degrees.

5. The apparatus of claim 1 wherein said conical thermal radiation reflecting means is a truncated conical thermal radiation reflecting means.

6. The apparatus of claim 5 wherein said truncated conical thermal radiation reflecting means further comprises a thermal radiation reflecting base surface and a thermal radiation reflecting truncated surface.

7. The apparatus of claim 1 further comprising means for evacuating said thermal processing chamber.

8. An apparatus for thermally processing a wafer comprising:

a plurality of elongated radiant heating means, arranged about an imaginary axis to extend along an imaginary conical surface about said imaginary axis;

a cylindrical thermal processing chamber within said plurality of elongated radiant heating means, said cylindrical thermal processing chamber having an imaginary axis which is coincident with the imaginary axis of said imaginary conical surface; and wafer holding means within said cylindrical thermal processing chamber, said wafer holding means comprising:

a wafer support extending transverse to the imaginary axis of said cylindrical thermal processing chamber, for supporting a wafer face transverse to the imaginary axis of said cylindrical thermal processing chamber; and means for moving said wafer support along the imaginary axis of said thermal processing chamber.

9. The apparatus of claim 8 wherein said plurality of elongated radiant heating means comprises a plurality of linear heat lamps.

10. The apparatus of claim 9 wherein said plurality of linear heat lamps extend along an imaginary truncated conical surface, from the base to the truncated surface thereof.

11. The apparatus of claim 10 wherein said plurality of linear heat lamps comprise a first and a second plurality of linear heat lamps, wherein said first plurality of linear heat lamps extend along said imaginary truncated cone from the base thereof towards the truncated surface thereof, and wherein said second plurality of linear heat lamps extend along said imaginary truncated cone from the truncated surface thereof towards the base thereof.

12. The apparatus of claim 11 wherein said first and said second plurality of linear heat lamps overlap at the center of said imaginary truncated cone between the base and truncated surface thereof.

13. The apparatus of claim 11 further comprising means for independently energizing said first and said second plurality of linear heat lamps.

14. The apparatus of claim 9 wherein said plurality or heat lamps comprise a plurality of tungsten-halogen heat lamps.

15. The apparatus of claim 8 wherein said imaginary conical surface forms a predetermined angle with the imaginary axis thereof, and wherein said predetermined angle is between about 7.5 degrees and about 30 degrees.

16. The apparatus of claim 15 wherein said predetermined angle is between about 10 degrees and about 20 degrees.

17. The apparatus of claim 16 wherein said predetermined angle is about 15 degrees.

18. The apparatus of claim 11 further comprising means for evacuating said thermal processing chamber.

19. An apparatus for thermally processing a wafer comprising:

conical thermal radiation reflecting means;

a plurality of elongated radiant heating means within said conical thermal radiation reflecting means, said plurality of elongated radiant heating means extending along an imaginary conical surface within said conical thermal radiation reflecting means;

a cylindrical thermal processing chamber within said plurality of elongated radiant heating means, said cylindrical thermal processing chamber having an imaginary axis which is coincident with the imaginary axis of said conical thermal radiation reflecting means; and wafer holding means within said cylindrical thermal processing chamber, said wafer holding means comprising:

a wafer support extending transverse to the imaginary axis of said cylindrical thermal processing chamber, for supporting a wafer face transverse to the imaginary axis of said cylindrical thermal processing chamber; and means for moving said wafer support along the imaginary axis of said thermal processing chamber.

20. The apparatus of claim 19 wherein said conical thermal radiation reflecting means and said imaginary conical surface both extend about a common imaginary axis and form a predetermined angle with said common imaginary axis, and wherein said predetermined angle is between about 7.5 degrees and about 30 degrees.

21. The apparatus of claim 20 wherein said predetermined angle is between about 10 degrees and about 20 degrees.

22. The apparatus of claim 21 wherein said predetermined angle is about 15 degrees.

23. The apparatus of claim 19 wherein said conical thermal radiation reflecting means is a truncated conical thermal radiation reflecting means.

24. The apparatus of claim 23 wherein said truncated conical thermal radiation reflecting means further comprises a thermal radiation reflecting base surface and a thermal radiation reflecting truncated surface.

25. The apparatus of claim 19 further comprising means for evacuating said thermal processing chamber.

26. The apparatus of claim 19 wherein said plurality of elongated radiant heating means comprises a plurality of linear heat lamps.

27. The apparatus of claim 26 wherein said plurality linear heat lamps extend along an imaginary truncated conical surface, from the base to the truncated surface thereof.

28. The apparatus of claim 26 wherein said plurality of linear heat lamps comprise a first and a second plurality of linear heat lamps, wherein said first plurality of linear heat lamps extend along said imaginary truncated cone from the base thereof towards the truncated surface thereof, and wherein said second plurality of linear heat lamps extend along said imaginary truncated cone from the truncated surface thereof toward the base thereof.

29. The apparatus of claim 28 wherein said first and said second plurality of linear heat lamps overlap at the center of said imaginary truncated cone between the base and truncated surface thereof.

30. The apparatus of claim 28 further comprising means for independently energizing said first and said second plurality of linear heat lamps.

31. The apparatus of claim 26 wherein said plurality of heat lamps comprise a plurality of tungsten-halogen heat lamps.

* * * * *

UNITED STATES PATENT AND TRADEMARK OFFICE
CERTIFICATE OF CORRECTION

PATENT NO. : 5,253,324                              Page 1 of 2
DATED      : October 12, 1993
INVENTOR(S): Wortman et al.

It is certified that error appears in the above-identified patent and that said Letters Patent is hereby corrected as shown below:

Title page, item [56],

References Cited:

U.S. PATENT DOCUMENTS:

Patent No. 5,070,815 "10/1991" should be --12/1991--.

Please add the following patents as cited in the PTO1449 of September 29, 1992:

| | | |
|---|---|---|
| 4,481,406 | 11-06-84 | Muka |
| 4,560,420 | 12-24-85 | Lord |
| 4,818,327 | 04-04-89 | Davis et al. |
| 4,956,538 | 09-11-90 | Moslehi |
| 4,988,533 | 01-29-91 | Freeman et al. |

Title page, FOREIGN PATENT DOCUMENTS: col. 2, line 2,

"62-228609" should be --63-228609--

OTHER PUBLICATIONS: col. 2, lines 3-5 and 6-8

Please add the following publications as cited in the PTO1449 of September 29, 1992:

*A Cylindrical Tube Based Rapid Thermal Processor*, D. T. Chapman et al., 179th Electrochemical Society Meeting, No. 358, pp. 541-550, May 1991

UNITED STATES PATENT AND TRADEMARK OFFICE
CERTIFICATE OF CORRECTION

PATENT NO. : 5,253,324            Page 2 of 2

DATED : October 12, 1993

INVENTOR(S) : Wortman et al.

It is certified that error appears in the above-identified patent and that said Letters Patent is hereby corrected as shown below:

*Temperature Uniformity in RTP Furances*, F. Yates Sorrell et al., IEEE Transactions on Electron Devices, Vol. 39, No. 1, January 1992, pp. 75-79

Column 3, after "15" insert --.--.

Column 5, line 50, "15" should be --25--.

Column 6, line 37, "7½" should be --7½°--.

Column 8, line 19, "11" should be --8--.

Column 9, line 4, after "plurality" insert --of--.

Column 9, line 8, "26" should be --27--.

Signed and Sealed this

Seventh Day of June, 1994

*Attest:*

BRUCE LEHMAN

*Attesting Officer*      Commissioner of Patents and Trademarks